United States Patent
Mulfinger et al.

(10) Patent No.: US 11,031,484 B2
(45) Date of Patent: Jun. 8, 2021

(54) SILICIDED GATE STRUCTURES

(71) Applicant: GLOBALFOUNDRIES U.S. INC., Santa Clara, CA (US)

(72) Inventors: George R. Mulfinger, Gansevoort, NY (US); Judson R. Holt, Ballston Lake, NY (US); Mark Raymond, Schenectady, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 33 days.

(21) Appl. No.: 16/456,268

(22) Filed: Jun. 28, 2019

(65) Prior Publication Data

US 2020/0411666 A1    Dec. 31, 2020

(51) Int. Cl.
*H01L 29/66* (2006.01)
*H01L 27/12* (2006.01)
*H01L 21/84* (2006.01)
*H01L 29/08* (2006.01)

(52) U.S. Cl.
CPC ........ *H01L 29/66507* (2013.01); *H01L 21/84* (2013.01); *H01L 27/1203* (2013.01); *H01L 29/0847* (2013.01)

(58) Field of Classification Search
CPC .............. H01L 29/66507; H01L 21/84; H01L 29/0847; H01L 27/1203
See application file for complete search history.

(56) References Cited

U.S. PATENT DOCUMENTS

| | | | |
|---|---|---|---|
| 2005/0136605 A1* | 6/2005 | Murto | H01L 21/823835 438/303 |
| 2009/0317950 A1* | 12/2009 | Okihara | H01L 29/42384 438/151 |
| 2019/0189785 A1* | 6/2019 | Jambunathan | H01L 29/66545 |

* cited by examiner

*Primary Examiner* — Quoc D Hoang
(74) *Attorney, Agent, or Firm* — Andrew M. Calderon; Roberts Calderon Safran & Cole, P.C.

(57) ABSTRACT

The present disclosure relates to semiconductor structures and, more particularly, to differential silicide structures and methods of manufacture. The structure includes: a substrate; a gate structure comprising a silicided gate region; and source and drain regions adjacent to the gate structure and comprising S/D silicided regions having a differential thickness compared to the silicided gate region.

20 Claims, 4 Drawing Sheets

SILICIDED GATE STRUCTURES

FIELD OF THE INVENTION

The present disclosure relates to semiconductor structures and, more particularly, to differential silicide structures and methods of manufacture.

BACKGROUND

As semiconductor processes continue to scale downwards, e.g., shrink, the desired spacing between features (i.e., the pitch) also becomes smaller. To this end, in the smaller technology nodes it becomes ever more difficult to fabricate features due to the critical dimension (CD) scaling and process capabilities.

For example, fully depleted silicon on insulator (FDSOI) structures require certain parameters for radio frequency (RF) applications. These parameters include lower gate to source/drain capacitance, lower gate resistance and higher drive current (DC) performance/conductance. However, conventional technologies are unable to co-optimize DC performance, capacitance and gate resistance. Generally, conventional technologies have silicidation regions which encroach too closely to the underlying buried oxide (BOX) layer, thereby increasing resistance and degrading device performance (Ron).

SUMMARY

In an aspect of the disclosure, a structure comprises: a substrate; a gate structure comprising a silicided gate region; and source and drain regions adjacent to the gate structure and comprising S/D silicided regions having a differential thickness compared to the silicided gate region.

In an aspect of the disclosure, a structure comprises: a substrate; a gate structure comprising sidewall spacers and a silicided gate region; and raised source and drain (S/D) regions adjacent to the gate structure and comprising S/D silicided regions having a differential thickness compared to the silicided gate region.

In an aspect of the disclosure, a method comprises: forming a gate structure comprising sidewall spacers and a silicided gate region over a substrate; and forming raised source and drain (S/D) regions over the substrate and adjacent to the gate structure and comprising S/D silicided regions having a different thickness than the silicided gate region.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1A:
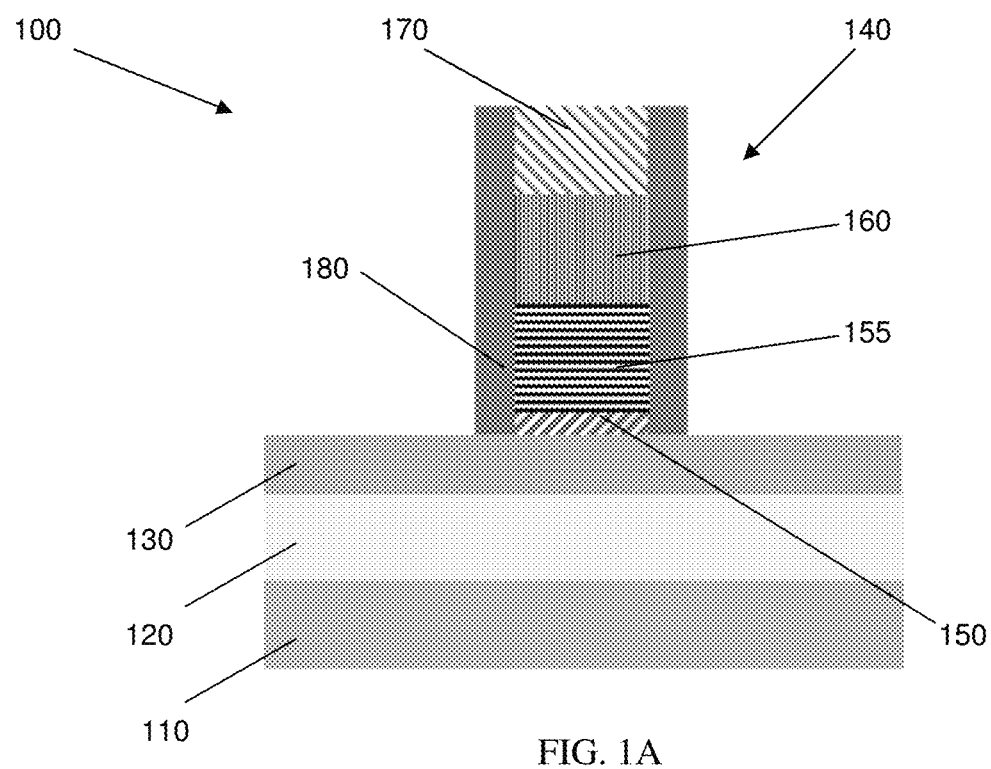
FIGS. 1A-1D show gate structures and respective fabrication processes in accordance with aspects of the present disclosure.

The present disclosure relates to semiconductor structures and, more particularly, to differential silicide structures and methods of manufacture. In embodiments, the present disclosure provides silicided gate structures together with relatively thinner silicide regions for source/drain (S/D) regions. Advantageously, the structures and processes described herein improve device performance (Ron) by limiting a distance of the silicide regions in the S/D regions with respect to the buried oxide (BOX) layer, while maximizing the silicide regions of the gate structures to reduce gate resistance.

The structures and processes described herein allow for relatively lower gate to S/D capacitance, relatively lower gate resistance and relatively higher drive current (DC) performance/conductance for RF applications. For example, the structures and processes described herein provide relatively lower gate resistance with raised source drain scaling, i.e., capacitance reduction, without degrading device performance. In embodiments, the structures and processes of the present disclosure can be applied to NFET regions and/or PFET regions of FDSOI devices.

In embodiments, raised S/D regions composed of an epitaxial stack of material enables differential silicide thicknesses between the gate structures and the S/D regions. The epitaxial stack includes a main layer and a relatively thin stop layer over the main layer. A capping layer is formed over the main layer and the stop layer, which serves to define a thickness for the silicide regions of the S/D regions. The relatively thin stop layer serves to slow down the diffusion of the silicidation process to the underlying layers, while the main layer provides a further distance between the silicide regions of the S/D regions and the BOX layer of fully depleted semiconductor on insulator (FDSOI). Accordingly, relatively thinner silicide regions are obtained in the S/D regions compared to relatively thicker silicide regions present in the gate structures. Silicided gate structures can also be provided.

The relatively thinner silicide regions in the S/D regions allow for further raised S/D scaling (capacitance reduction) without degrading DC performance. More specifically, DC performance is better maintained because the thinner silicide regions in the S/D regions have an adequate distance from the BOX layer, thereby preventing DC pinch-off. Also, by having thicker silicided regions of the gate structures, it is possible to lower the gate resistance, which is desirable for radio frequency (RF) applications.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures are built on wafers and are realized in films of material patterned by photolithographic processes on the top of a wafer. In particular, the fabrication of the structures use three basic building blocks: (i) deposition of thin films of material on a substrate, (ii) applying a patterned mask on top of the films by photolithographic imaging, and (iii) etching the films selectively to the mask.

FIGS. 1A-1D show an incoming structure 100 and respective fabrication processes in accordance with aspects of the present disclosure. The structure 100 is representative of fully depleted semiconductor on insulator (FDSOI) technologies. Specifically, the structure 100 can be representative of an NFET FDSOI device, although the structures and processes described herein can also be applied to PFET FDSOI devices. In this way, the substrate is a FDSOI substrate.

In embodiments, the structure 100 includes a substrate 110 which can be a silicon material; although other semiconductor materials are also contemplated herein. In embodiments, a PFET device can be comprised of cSiGe for the substrate 110. A BOX layer 120 is provided over the substrate 110 and a semiconductor-on-insulator (SOI) layer 130 is on the BOX layer 120. The SOI layer 130 can be composed of any suitable material including, but not limited to, Si, SiGe, SiGeC, SiC, GaAs, InAs, InP, and other III/V or II/VI compound semiconductors.

FIGS. 1A-1D further show gate structures 140 fabricated using any known gate formation processes, e.g., gate first processes. In embodiments, the gate structures 140 include a gate dielectric material 150 and a metallization stack 155 over the gate dielectric material 150. The gate dielectric material 150 can be deposited by conventional deposition processes, e.g., atomic layer deposition (ALD). In embodiments, the gate dielectric material 150 can be a high-k gate dielectric material, e.g., hafnium-based dielectrics. In further embodiments, the high-k dielectric materials can include, but are not limited: $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof.

The metallization stack 155 can include any workfunction metal or any combination of metals, e.g., TiN, depending on the application and design parameters. In embodiments, the deposition of the metallization stack 155 over the gate dielectric material 150 can occur by chemical vapor deposition (CVD) or physical vapor deposition (PVD), for example. A poly silicon (poly-Si) material 160 is deposited over the metallization stack 155. A gate mask material 170 is deposited over the poly-Si material 160. In embodiments, the gate mask material 170 can be deposited by CVD and be and composed of a nitride material. After the deposition of the materials 150, 155, 160, 170, the materials undergo a conventional patterning step, e.g., lithography and etching, to form the gate structures.

Sidewall spacers 180, e.g., a low-k dielectric, are deposited on sidewalls of the gate structures 140. The sidewall spacers 180 can be deposited by conventional CVD processes, followed by a patterning process, e.g., anisotropic etching process, to remove any material from horizontal surfaces of the structure 100.

Figure 1B:
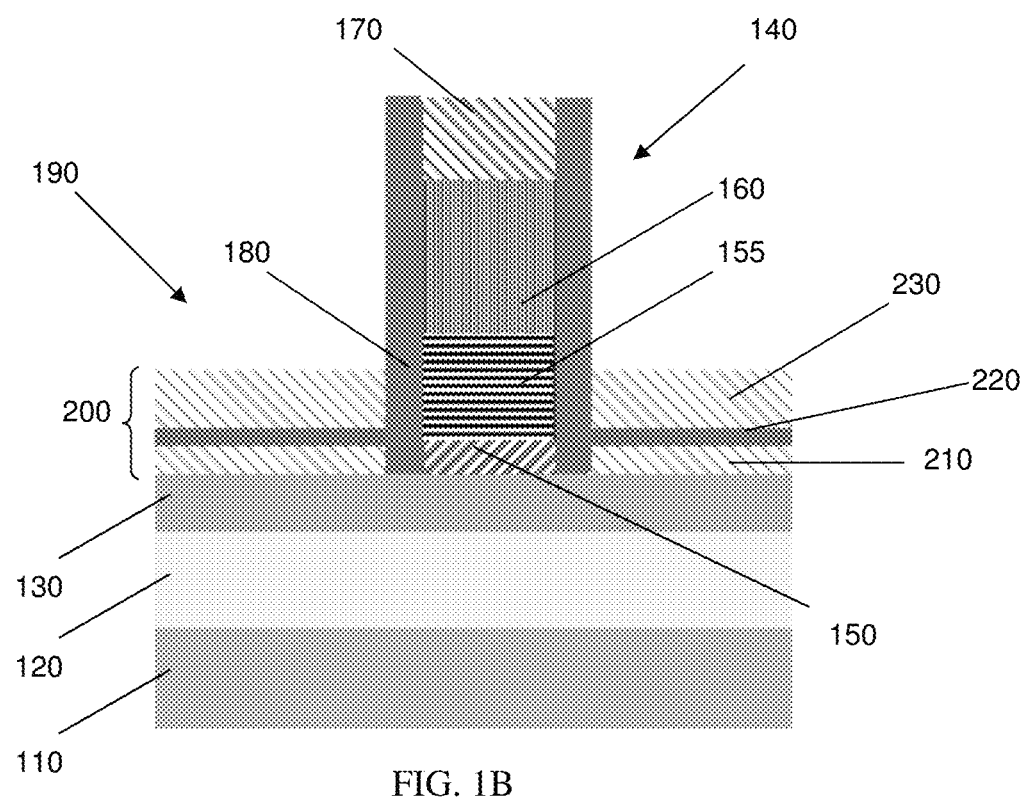
Figure 1C:
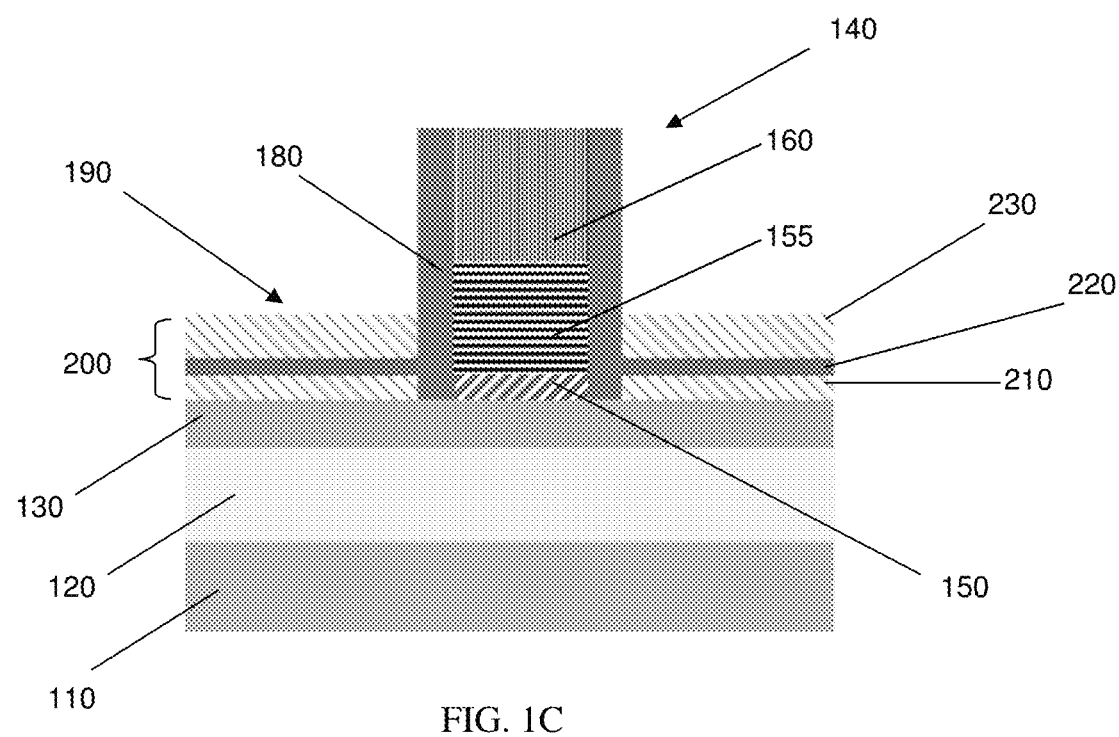
Figure 1D:
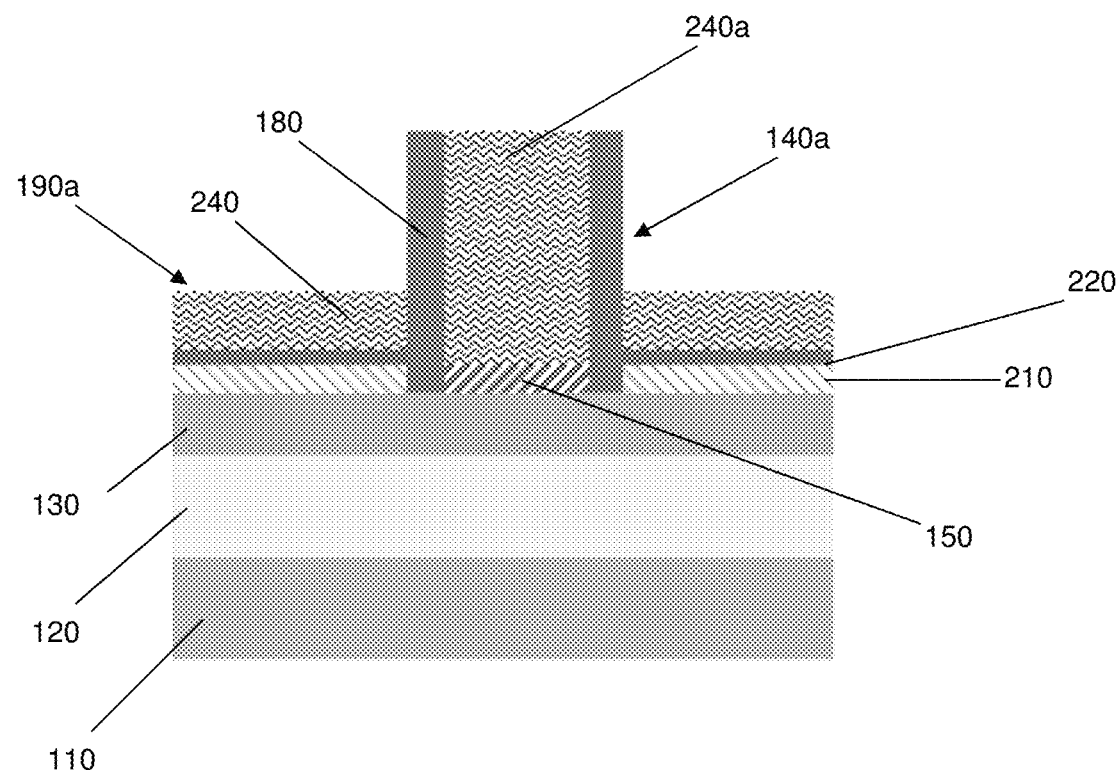

FIGS. 1B-1D show source and drain regions (S/D) 190 formed on sides of the gate structures 140, e.g., sides of the sidewall spacers 180. The S/D regions 190 can be raised S/D regions formed by a doped epitaxial growth on a surface of the SOI layer 130. In embodiments, the sidewall spacers 180 will prevent the growth of the epitaxial material on the gate structures 140. The S/D regions 190 are comprised of an epitaxial stack 200, composed of a main layer 210, a stop layer 220 and a cap layer 230. The main layer 210, stop layer 220 and a cap layer 230 can be grown in situ directly on the SOI layer 130, with the nitride material of the sidewall spacers 180 and gate mask material 170 preventing growth on a top surface of the gate structure 140. In this way, the S/D regions 190 are formed using a selective growth process.

In embodiments, the main layer 210 can be a silicon material doped with phosphorus (SiP), amongst other examples. As another example, for a PFET device, the main layer can be SiGe doped with boron. In embodiments, the thickness of the main layer 210 is in a range of about 1-5 nm, and preferably in a range of 2-4 nm. The stop layer 220 can be comprised of any material which is different than the main layer 210, e.g, SiP or SiGe (for a PFET). For example, the stop layer 220 can be comprised of a material having a carbon species or delta doping. In embodiments, the stop layer 220 can have a thickness in a range of about 1-5 nm, and preferably in a range of 2-4 nm, for example. More specifically, the stop layer 220 has a thickness which can slow down the silicidation process from extending into underlying layers, i.e., SOI layer 130. In this way, the stop layer 220 is structured to prevent or reduce siliciding of the main layer 210. Accordingly, the source and drain regions 190 are comprised of an epitaxial stack 200 which comprises a main layer 210 directly on the substrate 110 and a stop layer 220 composed of SiGe material over the main layer 210.

The cap layer 230 can be comprised of the same material as the main layer 210, i.e., SiP material. Further, the cap layer 230 has a thickness which assists in defining the silicide thickness for subsequent silicidation of the S/D regions 190. In embodiments, the cap layer 230 can have a thickness in a range of about 5-10 nm, and preferably in a range of 2-4 nm, for example. While the cap layer 230 defines the silicide thickness for the S/D regions 190, the stop layer 220 prevents or limits the silicidation of the cap layer 230 from diffusing deeper into the structure 100, e.g., main layer 210. Further, the thickness of the main layer 210 provides an additional distance between the silicided regions of the S/D regions 190 and the BOX layer 120. In this way, the main layer 210 and the stop layer 220 of the epitaxial stack 200 ensure that an adequate distance is maintained between the BOX layer 120 and any silicided regions of the S/D regions 190.

By providing an adequate distance between the silicided regions of the S/D regions 190 and the BOX layer 120, drive current (DC) pinch-off is prevented, thereby improving device performance. In embodiments, it is desirable to have this distance between the silicided regions and the BOX layer 120 at least above a range of about 6-7 nm in order to reduce resistance caused by the silicided regions encroaching the BOX layer 120.

FIG. 1C shows the removal of the gate mask material 170, thereby exposing the poly-Si material 160 for subsequent silicidation. In embodiments, the gate mask material 170 can be removed by depositing an oxide film over the structure 100, followed by an anisotropic etch to expose the gate mask material 170. In embodiments, hot phosphoric material can be used to remove the gate mask material 170, while the oxide film protects the remaining layers of the structure 100. The oxide film is then removed by HF.

Following removal of the gate mask material 170, a silicide process is performed to form silicided S/D regions 190a and the silicided gate structure 140a, as shown in FIG. 1D. The silicidation process is a self-aligned silicidation process as it is formed only on the exposed cap layer 230 of the epitaxial stack 200 and the exposed poly-Si material 160 of the gate structure 140.

As should be understood by those of skill in the art, the silicide process begins with a deposition of a thin transition metal layer, e.g., nickel or nickel platinum, over fully formed and patterned semiconductor layers (e.g., the cap layer 230 and the poly-Si material 160). After deposition of the thin transition metal material, the structure 100 is heated, allowing the thin transition metal to react with the material of the exposed cap layer 230 and the poly-Si material 160, thereby forming a low-resistance transition metal silicide. In embodiments, the annealing process can include a first anneal followed by a strip process, e.g., wet strip, to remove any unreacted metal material. Next, a second anneal process is performed.

Following the second anneal process, any remaining transition metal is removed by chemical etching, thereby forming silicide regions 240 in the silicided S/D regions 190a and a silicide gate region 240a in the silicided gate structure 140a. In this way, the structures and processes described herein provide for a substrate 110; a gate structure 140 comprising sidewall spacers 180 and a silicided gate region 240a; and raised source and drain (S/D) regions 190a adjacent to the gate structure 140 and comprising S/D silicided regions 240 having a differential thickness compared to the silicided gate region 240a.

In embodiments, the first anneal process can occur in a range of about 300-400° C., for an amount of time in a range of about 1-30 seconds. The second anneal process can occur in a range of about 350-500° C., for an amount of time in a range of about 1-30 seconds. Alternatively, the first and second annealing processes can occur through laser annealing, which can occur at a higher temperature in a range of about 600-850° C., with a dwell time in milliseconds. Further, it is also contemplated that a combination of the above or any annealing process which can allow the poly-Si material 160 to be silicided to lower the gate resistance can be implemented, it is then contemplated an anneal can be adjusted to tune the silicide thickness.

Referring to FIG. 1D, the silicide regions 240 of the silicided S/D regions 190a have a thickness less than a thickness of the silicide gate region 240a of the silicided gate structure 140a due to the stop layer 220 of the epitaxial stack 200. For example, the stop layer 220 keeps the silicide regions 240 relatively thin in the silicided S/D regions 190a, which enables thinner raised silicided source/drain regions. This can reduce capacitance and prevent drive current (DC) performance degradation caused by the silicide of the silicide regions 240 getting too close to the BOX layer 120. In this way, the epitaxial stack 200 further comprises a cap layer 230 over the SiGe material of the stop layer 220, the cap layer 230 defines a thickness for the differential thickness of the S/D silicided regions 240, 240a.

The relatively thinner silicide regions 240 of the silicided S/D regions 190a allow for further raised source/drain scaling (capacitance reduction) without degrading drive current (DC) performance, i.e., NFET DC performance. In this way, the structures and processes described herein allow for devices which co-optimize DC performance, capacitance and gate resistance desired for RF applications.

The silicide regions 240, 240a are self-aligned differential silicide structures because the silicidation process only silicides the exposed cap layer 230 and the exposed poly-Si material 160 of the gate structure 140. In this way, the differential thickness comprises the silicide regions 240 of the silicided S/D regions 190a having a thickness less than a thickness of the silicided gate region 240a. For example, the self-aligned differential silicide regions 240, 240a enable a silicided gate structure 140a, which will have a lower gate resistance than the gate structure 140. The lower gate resistance allows for device performance (Ron) to be improved, which is especially desirable for radio frequency (RF) applications. In embodiments, the silicided gate structure 140a can be fully silicided; although the structures and processes described herein are not limited to fully silicided gate structures.

Figure 2A:
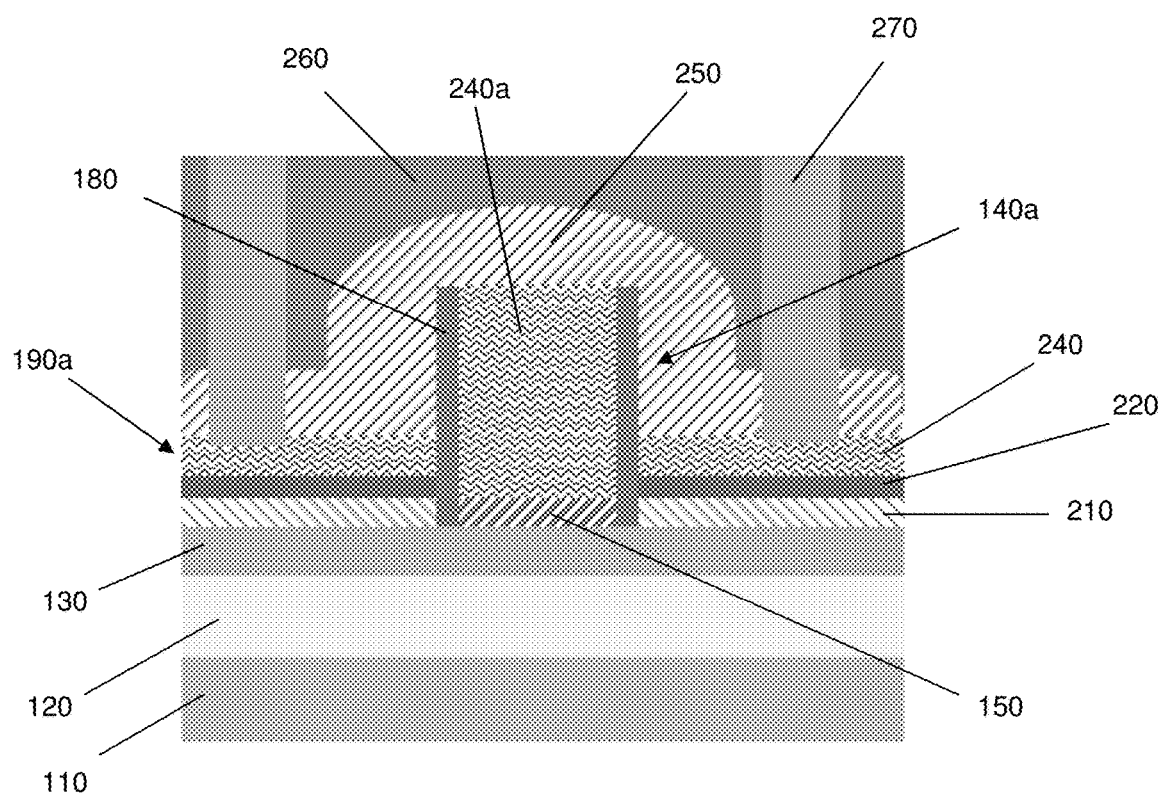
FIGS. 2A and 2B show self-aligned differential silicide structures, amongst other features, and respective fabrication processes in accordance with aspects of the present disclosure.
Figure 2B:
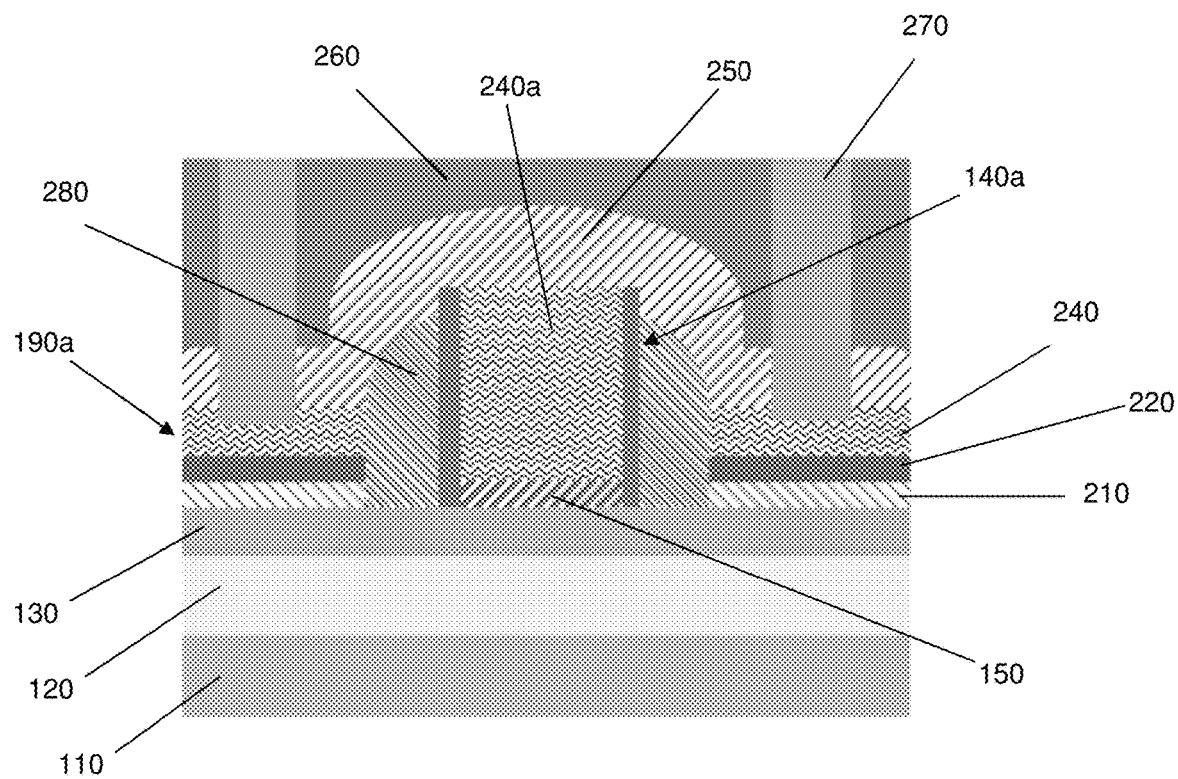

FIGS. 2A and 2B show a nitride layer 250 deposited over the silicided gate structure 140a and the silicided S/D regions 190a. In embodiments, the nitride layer 250 provides a stress layer to the silicide gate structure 140a and isolates the silicide gate structure 140a from the S/D contacts 270 to prevent shorting. In embodiments, the nitride layer 250 is deposited by a CVD process. A dielectric material 260 is deposited over the nitride layer 250. In embodiments, the dielectric material 260 is deposited by a CVD process and can be an oxide material.

The S/D contacts 270 are formed in contact with the silicide regions 240 of the silicided S/D regions 190a. To form the S/D contacts 270, trenches are formed within the dielectric material 260 to expose the silicided S/D regions 190a. In embodiments, the trenches are formed by a lithography process scheme followed by an etching (RIE) process scheme. For example, a resist formed over the dielectric material 260 is exposed to energy (light) to form a pattern (opening). An etching process with selective chemistries, e.g., RIE, will be used to form the trenches in the nitride layer 250 and the dielectric material 260, landing on the silicided S/D regions 190a.

The resist can then be removed by a conventional oxygen ashing process or other known stripants. The S/D contacts 270 are formed within the trenches on the silicided S/D regions 190a by deposition of a metal material. In embodiments, the S/D contacts 270 are comprised of a metal material composed of tungsten, amongst other examples. The metal material can be deposited by a CVD process, followed by a CMP process. In embodiments, a gate contact to the silicided gate structure 140a is also formed in contact with the silicide gate region 240a. In this way, the structures and processes described herein provide for a substrate 110; a gate structure 140a comprising a silicided gate region 240a; and source and drain regions 190a adjacent to the gate structure 140a and comprising S/D silicided regions 240 having a differential thickness compared to the silicided gate region 240a.

FIG. 2B shows an alternative structure comprising spacers 280, in addition to the structures shown in FIG. 2A. In this way, there are spacers 280 adjacent to the sidewall spacers 180 of the gate structure 140a and landing directly on the substrate 110. The spacers 280 are formed prior to the epitxial growth of the epitaxial stack 200 and the silicidation processes to further isolate the silicide gate structure 140a from the S/D contacts 270. In embodiments, the spacers 280 are deposited on sidewalls of the sidewall spacers 180 and can be comprised of a low-k dielectric material.

The spacers 280 can be deposited by conventional CVD processes, followed by a patterning process, e.g., anisotropic etching process, to remove any material from horizontal surfaces of the structure 100. For the PFET, the SOI layer 130 can be cSiGe, while for the NFET the SOI layer 130 can be SiP. In this way, the gate structure 140 and the source and drain regions 190 are formed on an NFET region of the FDSOI substrate or a PFET region of the FDSOI substrate 110. Specifically, the substrate 110 is an FDSOI substrate and the gate structure 140 and the raised S/D regions 190 are formed on an NFET region of the FDSOI substrate 110 which is composed of SiP material. Alternatively, the gate structure 140 and the raised S/D regions 190 are formed on a PFET region of the FDSOI substrate 110 which is composed of cSiGe material.

A modification of a surface/top layer of the stop layer 220 can be implemented so that there is a further stopping/slowing of the silicidation process. For example, an additional SiGe material comprising a composition different than the stop layer 220 can be applied to the surface of the stop layer in the PFET region. In this way, the structures and processes described herein provide for an additional SiGe material directly on the surface of the stop layer 220 in the NFET region or PFET region, wherein the stop layer 220 comprises SiGe material and the additional SiGe material comprises a different composition than the SiGe material of the stop layer 220. Alternatively, the stop layer 220 can be delta-doped to modify the stop layer with a different doping to further prevent diffusion of the silicidation process to the underlying layers.

Figure 3:
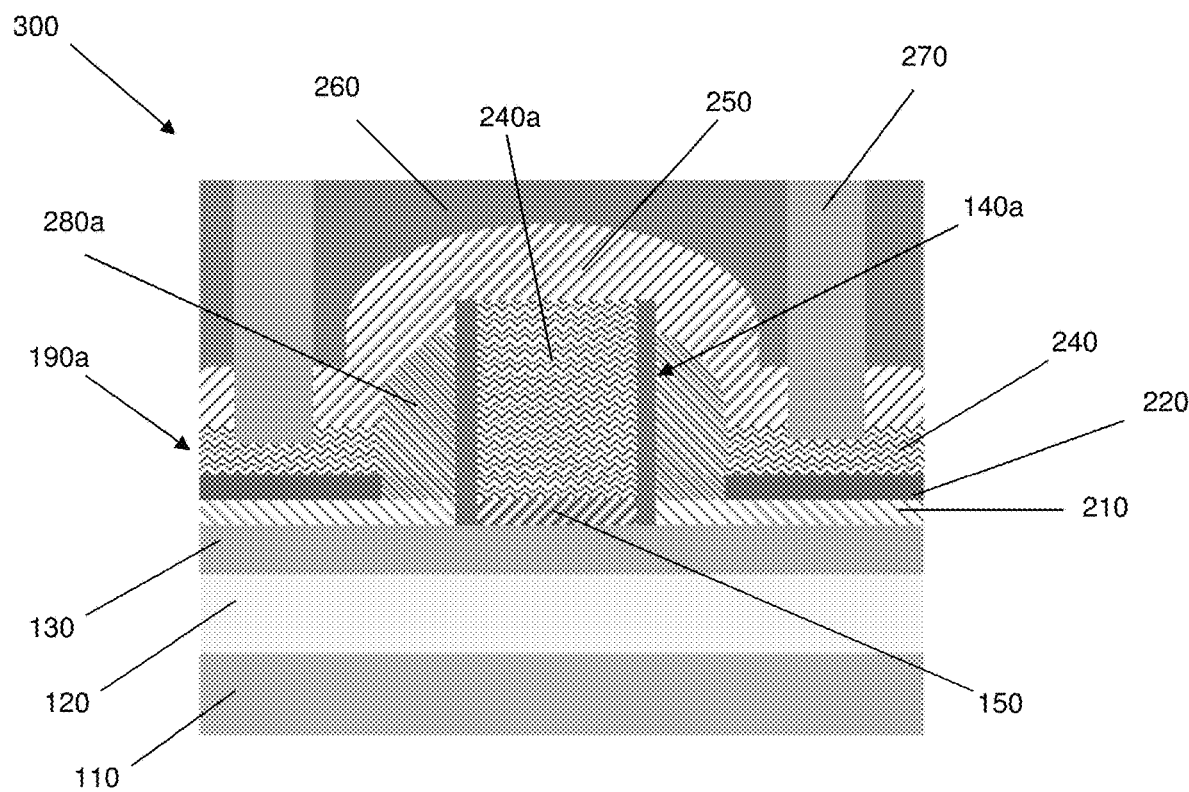
FIG. 3 shows an alternative self-aligned differential silicide structure, amongst other features, and respective fabrication processes in accordance with aspects of the present disclosure.

FIG. 3 shows an alternative differential silicided structure 300 in accordance with aspects of the present disclosure. Specifically, structure 300 can represent either a NFET or a PFET. In this embodiment, the main layer 210 is grown and then the spacers 280a are formed in the manner already described above for either a NFET or PFET. In this way, the spacers 280a land on the main layer 210, as opposed to spacers 280 landing on the SOI layer 130. Accordingly, the structures and processes described herein comprise spacers 280a adjacent to the sidewall spacers 180 of the gate structure 140 and landing directly on the main layer 210. Following formation of the spacers 280a, the remaining epitaxial layers, i.e., stop layer 220 and cap layer 230, can be grown in the processes described herein. This is followed by the remaining processes described for FIGS. 1A-2B. In this way, the structures and processes described herein comprise a nitride layer 250 over the gate structure 140a, the raised S/D regions 190a and the spacers 280a.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
a substrate;
a gate structure comprising a silicided gate region; and
source and drain regions adjacent to the gate structure and comprising source/drain (S/D) silicided regions having a differential thickness compared to the silicided gate region, wherein the source and drain regions comprise an epitaxial stack which comprises a main layer directly on the substrate and a stop layer over the main layer.

2. The structure of claim 1, wherein the differential thickness comprises the S/D silicided regions having a thickness less than a thickness of the silicided gate region.

3. The structure of claim 2, wherein the stop layer comprises SiGe material over the main layer.

4. The structure of claim 3, wherein the epitaxial stack further comprises a cap layer over the SiGe material which defines a thickness for the differential thickness of the S/D silicided regions.

5. The structure of claim 4, wherein the stop layer is structured to prevent or reduce siliciding of the main layer.

6. The structure of claim 1, wherein the substrate is a fully depleted silicon on insulator (FDSOI) substrate.

7. The structure of claim 6, wherein the gate structure and the source and drain regions are formed on an NFET region of the FDSOI substrate or a PFET region of the FDSOI substrate.

8. The structure of claim 1, wherein the source and drain regions are raised source and drain regions.

9. The structure of claim 1, wherein the epitaxial stack further comprises a cap layer directly on the stop layer, the cap layer has a thickness which defines a silicide thickness for the S/D silicided regions, and the S/D silicided regions have a thickness different from the silicided gate region.

10. A structure comprising:
a fully depleted semiconductor on insulator (FDSOI) substrate;
a gate structure comprising sidewall spacers and a silicided gate region; and
raised source and drain (S/D) regions adjacent to the gate structure and comprising S/D silicided regions having a differential thickness compared to the silicided gate region, wherein the raised S/D regions comprise an epitaxial stack comprising a main layer, a stop layer and a cap layer over the main layer, and the raised S/D regions are formed on a PFET region of the FDSOI substrate.

11. The structure of claim 10, further comprising spacers adjacent to the sidewall spacers of the gate structure and landing directly on the substrate.

12. The structure of claim 10, wherein the gate structure and the raised S/D regions are formed on an NFET region of the FDSOI substrate which comprise SiP material.

13. The structure of claim 10, wherein the FDSOI substrate comprises cSiGe material.

14. The structure of claim 13, wherein the stop layer and the cap layer comprise cSiGe material.

15. The structure of claim 14, further comprising an additional SiGe material directly on the surface of the stop layer in the PFET region, wherein the stop layer comprises SiGe material and the additional SiGe material comprises a different composition than the SiGe material of the stop layer.

16. The structure of claim 15, further comprising spacers adjacent to the sidewall spacers of the gate structure and landing directly on the main layer.

17. The structure of claim 16, further comprising a nitride layer over the gate structure, the raised S/D regions and the spacers.

18. The structure of claim 10, wherein the cap layer is directly over the stop layer and includes a thickness which defines a silicide thickness for the raised S/D silicided regions, the stop layer comprises a material different than the main layer, and the S/D silicided regions have a thickness different from the silicided gate region.

19. A method comprising:
forming a gate structure comprising sidewall spacers and a silicided gate region over a substrate; and
forming raised source and drain (S/D) regions over the substrate and adjacent to the gate structure and comprising S/D silicided regions having a different thickness than the silicided gate region, wherein
the substrate comprises an FDSOI substrate, the gate structure and the raised S/D regions are formed on a PFET region of the FDSOI substrate comprising cSiGe material, and the raised S/D regions comprise an epitaxial stack comprising a main layer, a stop layer and a cap layer over the cSiGe material.

20. The method of claim 19, wherein the raised S/D regions are formed by growing an epitaxial stack having a cap layer which defines the thickness of the S/D silicided regions and further comprising forming spacers adjacent to the sidewall spacers of the gate structure.

* * * * *